(12) United States Patent
Brons et al.

(10) Patent No.: US 9,142,933 B2
(45) Date of Patent: Sep. 22, 2015

(54) METHOD AND DEVICE FOR CONTROLLING A CARRIER-ENVELOPE PHASE AND/OR AN INTENSITY OF OUTPUT PULSES OF A PULSE LASER DEVICE

(71) Applicants: Ludwig-Maximilians-Universitaet Muenchen, Munich (DE); Max-Planck-Gesellschaft zur Foerderung der Wissenschaften e.V., Munich (DE)

(72) Inventors: Jonathan Brons, Unterschleissheim (DE); Marcus Seidel, Garching (DE); Oleg Pronin, Garching (DE); Alexander Apolonskiy, Garching (DE)

(73) Assignees: Ludwig-Maximilians-Universitaet Muenchen, Munich (DE); Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 0 days.

(21) Appl. No.: 14/523,456

(22) Filed: Oct. 24, 2014

(65) Prior Publication Data

US 2015/0117481 A1    Apr. 30, 2015

(30) Foreign Application Priority Data

Oct. 25, 2013    (EP) .................................... 13005100

(51) Int. Cl.
*H01S 3/063*    (2006.01)
*H01S 5/0683*    (2006.01)
(Continued)

(52) U.S. Cl.
CPC ............... *H01S 3/0632* (2013.01); *H01S 3/091* (2013.01); *H01S 3/0941* (2013.01);
(Continued)

(58) Field of Classification Search
CPC ....... H01S 3/0632; H01S 3/091; H01S 3/094; H01S 3/094076; H01S 3/0941; H01S 3/16; H01S 3/23
See application file for complete search history.

(56) References Cited

U.S. PATENT DOCUMENTS 6,785,303 B1    8/2004    Holzwarth et al.
6,850,543 B2    2/2005    Cundiff et al.
(Continued)

FOREIGN PATENT DOCUMENTS

EP    1026795 A2    8/2000
EP    1081819 A2    3/2001

OTHER PUBLICATIONS

Balciunas et al., "Carrier envelope phase stabilization of a Yb:KGW laser amplifier", Optics Letters, vol. 36. No. 16, pp. 3242-3244 (2011).

(Continued)

*Primary Examiner* — Armando Rodriguez
(74) *Attorney, Agent, or Firm* — Caesar Rivise, PC

(57) ABSTRACT

A method of controlling output pulses of a pulse laser device (100) including thin-disk laser medium (10), in particular controlling a carrier-envelope phase and/or an intensity noise of the output pulses, includes pumping thin-disk laser medium (10) of pulse laser device (100) with multiple pump laser diodes (21, 22, 23), having at least one modulated laser diode (21, 22) powered by current source (31, 32) with modulation capability, and controlling the output pulses by modulating the output power of the at least one modulated laser diode (21, 22), which is modulated by controlling a drive current thereof, wherein the pump laser diodes further include at least one stable laser diode (23), having constant output power, and the output power of the at least one modulated laser diode (21, 22) is smaller than the whole output power of the stable laser diode(s) (23). A pulse laser device (100) is also described.

15 Claims, 5 Drawing Sheets

(51) Int. Cl.
H01S 3/091 (2006.01)
H01S 3/0941 (2006.01)
H01S 3/23 (2006.01)
H01S 3/094 (2006.01)
H01S 3/16 (2006.01)

(52) U.S. Cl.
CPC ............ *H01S 3/094076* (2013.01); *H01S 3/23* (2013.01); *H01S 5/06835* (2013.01); *H01S 3/094* (2013.01); *H01S 3/16* (2013.01)

(56) References Cited

U.S. PATENT DOCUMENTS 7,474,457 B2    1/2009    Krausz et al.
2012/0020380 A1    1/2012    Boettcher et al.

OTHER PUBLICATIONS

Bauer et al., "Mode-locked Yb:YAG thin-disk oscillator with 41 uJ pulse energy at 145 W average infrared power and high power frequency conversion", Optics Express, vol. 20. No. 9, pp. 9698-9704 (2012).

Klenner et al., "Phase-stabilization of the carrier-envelope-offset frequency of a SESAM modelocked thin disk laser", Optics Express, vol. 21, No. 21, pp. 24770-24780 (2013).

Meyer et al., "Diode-pumped Yb:KYW femtosecond laser frequency comb with stabilized carrier-envelope offset frequency", Eur. Phys. J. D, pp. 19-26 (2008).

Noordegraaf, "Fused combiners for photonic crystal fibers", Ph.D. Thesis (134 pages), Jan. 2, 2012.

Pronin et al., "High-power 200 Fs Kerr-lens mode-locked Yb:YAG thin-disk oscillator", Optics Letters, vol. 36, No. 24, pp. 4746-4748 (2011).

Saraceno et al., "275 W average output power from a femtosecond thin disk oscillator operated in a vacuum environment", Optics Express, vol. 20, No. 21, pp. 23535-23541 (2012).

Telle et al., "Carrier-envelope offset phase control: A novel concept for absolute optical frequency measurement and ultrashort pulse generation", Appl. Phys. B, vol. 69, pp. 327-332 (1999).

METHOD AND DEVICE FOR CONTROLLING A CARRIER-ENVELOPE PHASE AND/OR AN INTENSITY OF OUTPUT PULSES OF A PULSE LASER DEVICE

FIELD OF THE INVENTION

The present invention relates to a method for controlling a carrier-envelope phase and/or an intensity of output pulses of a pulse laser device. Furthermore, the present invention relates to a pulse laser device creating output pulses having a controlled carrier-envelope phase and/or intensity of the output pulses. Applications of the invention are available e. g. in non-linear spectroscopy, high laser light field applications, frequency combs and measurements using femtosecond and sub-femtosecond laser pulses.

BACKGROUND OF THE INVENTION

For illustrating background art in the field of pulse laser technique, reference is made to the following prior art documents.
[1] D. Bauer et al. in "Opt. Express", vol. 20, 2012, p. 9698;
[2] C. Saraceno et al. in "Opt. Express", vol. 20, 2012, p. 23535;
[3] O. Pronin et al. in "Opt. Lett.", vol. 36, 2011, p. 4746;
[4] S. A. Meyer et al. in "Eur. Phys. J. D", vol. 48, 2008, p. 1926;
[5] T. Balcunias et al. in "Opt. Lett.", vol. 36, 2011, p. 3242
[6] H. R. Telle et al. in "Appl. Phys. B", vol. 69, 1999, p. 327;
[7] U.S. Pat. No. 7,474,457;
[8] D. Noordegraaf, "Fused combiners for photonic crystal fibers" Ph.D. Thesis 2012;
[9] EP 1 081 819;
[10] U.S. Pat. No. 6,785,303 B1; and
[11] U.S. Pat. No. 6,850,543 B2.

Various applications of pulse laser devices (pulse laser oscillators), e. g. in non-linear spectroscopy and high field applications require a stabilization of the laser output. Intensity fluctuations may be caused by a noisy oscillator, e. g. due to an intrinsic mode-locking behavior or cooling of the laser medium. Furthermore, in the fields of femtosecond and sub-femtosecond physics and frequency comb generation, wherein laser pulses are used in measurements with the demand for maximal temporal and/or spectral resolution, a carrier envelope phase (CEP) control is required for minimizing effects of CEP noise. Depending on the application of the pulse laser device, each of the intensity stabilisation, in particular intensity noise reduction, and CEP stabilisation can be implemented alone, or both can be provided in parallel.

It is generally known that thin disk (TD) laser technique allows creating sub-ps pulses with high average powers and high energies [1, 2]. A pulse laser oscillator is described e. g. in [3], wherein 45 W, 1.1 µJ and 250 fs output pulses are created with a pump power of about 220 W. Low power solid state oscillators and fiber oscillators can be CEP stabilized by controlling a supply current of a pump diode[4, 5].

According to [4], a bulk laser crystal of a pulse laser oscillator is pumped with two Bragg grating stabilized pump laser diodes. The pump laser diodes are arranged with a standard geometry wherein the bulk crystal is end-pumped from both sides for increasing the pump power. One of the pump laser diodes is stabilized by modulating the supply current thereof in dependency on CEP of the output pulses. However, the stabilization effect obtained by Meyer et al. is limited due to a very noisy operation of the oscillator, which results from a mutual interaction of the laser diodes pointed towards each other. Moreover, this geometry is not applicable to high-power thin-disk lasers due to the low single-pass-absorption in a disk medium.

Applying the concept of [4] to high power solid state oscillators would be highly desirable. However, this requires fulfilling the following crucial criteria for a constant current power supply for CEP stabilization:
a) high current stability;
b) analogue control of drive current; and
c) broad bandwidth (more than several tens of kHz) of the analogue control.

Practical test of available high power constant current power supplies (>400 W) have shown that they do not satisfy all three criteria a) to c). It is very difficult to steer high currents on the one hand with a high stability and on the other hand with high dynamics. It has been found that this problem cannot be solved by combining low power current supplies connected in parallel or in series. It is difficult to avoid crosstalk between the devices, and this approach would by expensive and bulky.

Optically combining the output of many laser diodes is inherent to the operation of diode bars and diode stacks, resp. It has been proposed to combine the output of the diodes into a single fiber, e. g. using a monolithic all-fiber combiner [8]. The conventional fiber combiners have limitations in terms of the capability of combining beams with different properties, e. g. different power. Furthermore, a free space combination of the diode output has been described [9].

OBJECTIVE OF THE INVENTION

The objective of the invention is to provide an improved method for controlling output pulses of a thin-disk pulse laser device, in particular for controlling, e. g. stabilizing the CEP and/or controlling, e. g. stabilizing the intensity (minimising the intensity noise) of the output pulses, which is capable of avoiding disadvantages of conventional techniques. In particular, the objective is to provide a control method which can be implemented for controlling a high power thin-disk pulse laser device with available constant current power supplies and without impairing the pulse stability. Furthermore, the objective of the invention is to provide an improved thin-disk pulse laser device, which is capable of avoiding disadvantages of conventional laser oscillators and which in particular is adapted for conducting the inventive pulse control method.

SUMMARY OF THE INVENTION

The above objective is solved by a pulse control method and/or a thin-disk pulse laser device of the invention.

According to a first general aspect of the invention, the above objective is solved by a method of controlling output pulses of a pulse laser device, wherein a thin disk laser medium (or: disk-shaped laser medium) is pumped with multiple continuous wave (cw) pump laser diodes. Controlling the output pulses of the pulse laser device preferably includes controlling an pulse intensity noise and/or the CEP of the output pulses. The multiple pump laser diodes include at least one modulated laser diode. The term "modulated laser diode" refers to a laser diode being capable of a broadband control of the laser diode output power. Contrary to high power laser diodes which can be modulated in a QCW (quasi CW) mode, the modulated laser diode is a laser diode being capable of a broadband control with a bandwidth of at least 10 kHz, preferably at least 20 kHz, e. g. at least 50 kHz. The bandwidth can be defined e. g. from the Bode magnitude and Bode phase plots and corresponds to a flat part of the magnitude and phase response vs. frequency (ripples <3 db). The modulated laser diode is powered by an associated current source with broadband modulation capability modulating a drive current of the modulated laser diode with the above bandwidth. The output pulses are controlled by modulating the output power of the at least one modulated laser diode, which is modulated by controlling a drive current thereof. The at least one modulated laser diode has a variable output power which can be changed for adjusting (setting) the intensity and/or CEP of the output pulses.

According to the invention, the pump laser diodes further include at least one stable laser diode, which has a constant output power. The term "stable laser diode" (or: stabilized laser diode) refers to a laser diode with low noise performance obtained by at least one of active stabilizing measures, like e. g. noise eater, active stabilization, and active electronics, and using a passively stable power current source. Contrary to the at least one modulated laser diode, the at least one stable laser diode (i. e. one or more stable laser diodes) is arranged for providing pump light with constant output power. Furthermore, according to the invention, the output power of the at least one modulated laser diode is smaller than the whole output power of the at least one stable laser diode.

According to a second general aspect of the invention, the above objective is solved by a pulse laser device, being adapted for creating output pulses, preferably having a controlled intensity and/or CEP, comprising a thin disk laser medium and multiple pump laser diodes being arranged for optically pumping the thin disk laser medium. The pump laser diodes include at least one modulated laser diode, which is connected with a current source with modulation capability. If multiple modulated laser diodes are provided, each of them is provided with a separate current source with modulation capability. The current source with modulation capability is arranged for modulating a drive current of the respective modulated laser diode, so that the output pulses can be controlled by modulating the output power of the at least one modulated laser diode. According to the invention, the pump laser diodes further include at least one stable laser diode, which is connected with a stabilized current source, and the at least one modulated laser diode and the respective current source with modulation capability are configured such that the output power of the at least one modulated laser diode is smaller than the whole output power of the at least one stable laser diode. Preferably, the pulse laser device is adapted for conducting the method according to the above first aspect of the invention.

The solution provided by the present invention is based on pumping the thin disk laser medium with a plurality of pump laser diodes each with a specific current source. It is proposed to connect not all of the pump laser diodes with one common current source. Advantageously, it is not required that each of the current sources fulfils each of the above criteria a) to c). The pulse amplitudes and the actual CEP are a function of the pump power applied to the laser medium. The inventors have found, that reliable and precise pulse control can be obtained with a modulation depth of the pump power below 50%, i. e. criteria b) and c) have to be fulfilled by a portion of current sources only. According to a preferred embodiment of the invention, the modulation depth of the output power of the at least one modulated laser diode is at least 2% and/or at most 20% of a pump power absorbed by the laser medium. Particularly preferred, the modulation depth is in a range of 2% to 20% of the whole output power of the one or more stable laser diode(s).

Contrary to [4], most of the pump laser diode output power can be provided by driving one or more stable diodes with one single common current source (stabilized current source) which is adapted for an operation with high current stability, e. g. with RMS fluctuations <0.01%. On the other hand, the at least one current source with modulation capability connected with the at least one modulated pump diode, resp., can be designed with a current stability which is lower than the current stability of the stabilized current source. As a consequence, most of the pump power is adjusted by a high power, low noise current source, which is combined with a lower power modulating current source. Advantageously, the noise of the stable laser diode(s) (high power) is determined by the stabilized (stable) current source and thus is very low. The noise of the pulse laser device (oscillator) is also very low due to the low noise of the stabilized laser diode(s). The noise of the pulse laser device is transferred to noise of free running CEP, and the lower the free running CEP noise, the easier and more precise it is possible to stabilize the CEP.

As an important advantage, the invention introduces a new generation of pulse laser devices which provide an alternative to generally known Ti:sapphire laser oscillators which are broadly used for creating laser pulses. While Ti:sapphire laser oscillators may have disadvantages in terms of costs (price per watt of output power), the inventive pulse laser device, based on thin-disk technique, has a compact and low costs structure.

The thin-disk laser medium is a solid state laser medium (laser crystal) which is arranged in a resonator cavity and which is adapted for creating the output light pulses in response to the absorption of pump light. Various configurations of the laser medium and the resonator cavity are available for applying the invention. Preferably, the thin-disk laser medium has a crystal disk thickness of at least 50 µm, in particular at least 80 µm and/or at most 200 µm, in particular at most 300 µm. The inventive pulse laser device is a disk laser including the thin-disk laser medium, which is arranged in the resonator cavity. A back surface of the thin-disk laser medium is provided with a reflector layer, and the laser medium with the reflector layer provides a resonator mirror of the resonator cavity. Pumping the thin-disk laser medium has advantages in particular in terms of high output power, simple cooling of the crystal, and stability of output beam shape. Furthermore, the thin-disk laser medium has a pumping geometry, wherein the pump light (output of all laser diodes) is relayed from one common side onto the crystal disk. Thus, interactions of the laser diodes are avoided as they can occur with the technique of [4]. Additionally absorption in such multipass thin-disk pumping geometry is high (>90%) resulting in a small back (to pump diodes) reflection. Moreover, the pumping cavity of the disk module can be aligned in a way that this back reflection is not coupled to the pump diodes. Advantageously this alignment has negligible influence on the pump spot on the disk.

The thin-disk laser medium is pumped with the multiple pump laser diodes, i. e. the output light of the laser diodes is applied simultaneously to the laser medium. Preferably, the output light contributions of all laser diodes are combined and commonly relayed to the laser medium. Thus, the noise resulting from a mutual laser diode interaction as obtained with the technique of [4] is avoided. Advantageously, multiple variants are available for combining the output of the at least one stable laser diode and the output of the at least one modulated laser diode.

According to a first variant, a beam combiner can be used for a free space beam combination of the output light contributions of the laser diodes. Advantageously, the free space beam combination provides for a high optical power and a good beam quality. The free space beam combination may comprise a combination of light beams through focusing into one common fiber. The fiber has a numerical aperture which is high enough for accommodating the spatially separated light beams. Furthermore, beams with different polarizations can be combined by means of a polarizing beam combiner. Thirdly, the at least one stable laser diode and the output of the at least one modulated laser diode emit at different wavelengths and the beam combiner uses a dichroic mirror for superimposing the output of the laser diodes into a common light path.

According to second variant, a fiber beam combiner can be used for combining the diodes output. The fiber beam combiner may have advantages for providing a compact structure of the pulse laser device. Possible fiber beam combiners are 2*1-combiners combining one high power fibre and one low power fiber or N combiners combining N multiple low power fibers.

According to a preferred embodiment of the invention, not only the CEP or the intensity noise of the output pulses, but both the CEP and an oscillator intensity noise of the output pulses can be controlled by modulating the output power of the at least one modulated laser diode. The at least one modulated laser diode is varied such that the CEP noise and the intensity noise are minimized. This embodiment has particular advantages for frequency comb applications of the inventive technique.

According to a further preferred embodiment of the invention, the at least one stable laser diode and the at least one modulated laser diode are operated at different output wavelengths selected in accordance to absorption maxima of the laser medium. Two wavelengths $\lambda_1$ and $\lambda_2$ are considered here as different wavelengths if their bandwidths at full width half maximum (FWHM) $\Delta\lambda_1$, $\Delta\lambda_2$ satisfy the relation $|\lambda_2-\lambda_1|>\Delta\lambda_1+\Delta\lambda_2$. This embodiment may have advantages in terms of facilitating the beam combination using the free space beam combination including at least one dichroic mirror. Furthermore, the pump power can be increased, as the typically narrowband output of the laser diodes can be adapted to the absorption spectrum of the laser medium. Furthermore, for anisotropic thin-disk crystals pumping at multiple wavelengths can change and shape the gain emission.

According to yet a further preferred embodiment of the invention, the at least one stable laser diode and the at least one modulated laser diode are operated at different polarizations, i. e. the polarization of the output light of the at least one stable laser diode differs from the polarization of the output light of the at least one modulated laser diode. Again, advantages for combining the diodes output can be obtained.

If according to a further preferred embodiment of the invention, the at least one modulated laser diode is modulated by an analogue control of the drive current thereof, the continuity of the CEP and/or intensity control can be improved. With this embodiment, the current source with modulation capability includes an analogue control unit. Additionally, the at least one modulated laser diode preferably is modulated with the broadband control having the bandwidth of at least 10 kHz, preferably at least 20 kHz, e. g. at least 50 kHz.

The inventive pulse control includes a setting of the pulse intensity and/or CEP by modulating the at least one modulated laser diode. This setting may be conducted with a fixed modulation protocol as a function of the configuration of the pulse laser device and/or depending on a particular application of the invention.

However, with a particularly preferred embodiment of the invention, the pulses are loop-controlled and stabilized in dependency on current pulse intensity and/or CEP measured with the pulse laser device. Accordingly, the pulse laser device preferably includes a first control loop (CEP loop) for controlling the carrier-envelope phase of the output pulses, wherein the drive current of the at least one modulated laser diode is controlled in dependency on a detected carrier-envelope offset frequency of the output pulses of the pulse laser device and a radiofrequency reference signal. Alternatively or additionally, the pulse laser device preferably includes a second control loop (intensity noise loop) for controlling the intensity of the output pulses, wherein the drive current of the at least one modulated laser diode is controlled in dependency on a detected oscillator noise. The second control loop additionally provides an oscillator intensity noise control. The output pulses of the pulse laser device are subjected to an oscillator intensity noise compensation using the second control loop. The provision of the second control loop is preferred if the stabilized laser diode introduces a residual intensity noise or the oscillator itself is generating extra-noise (not stable enough). Depending on the application and intensity noise requirements of the operated pulsed thin-disk laser, the second control loop can be omitted. Furthermore, the second control loop can be used as an independent control loop for only intensity noise stabilization.

Advantageously, an active phase control is provided, which is based on the intensity-dependent non-linear carrier-envelope phase shift and/or pulse intensity change due to a change of the pump power and consequently intracavity power. Advantageously, no absorbing or scattering parts are added to the light path in the pulse laser device, so that the CEP and/or intensity control is resistant against laser damage and provides power scalability. This power scalability is especially important when pump powers >500 W and intracavity power >5 kW are considered.

With a further preferred modification of the active phase control embodiment, when both of the first and second loops are provided and the pump laser diodes include at least two modulated laser diodes, the first control loop is used for controlling a first one of the at least two modulated laser diodes and the second control loop is used for controlling a second one of the at least two modulated laser diodes.

If both control loops are provided, the modulated laser diodes of the first and second control loops preferably are operated at different output wavelengths, which are selected in accordance to absorption maxima of the laser medium. Additionally or alternatively, the modulated laser diodes of the first and second control loops can be operated at different polarizations and/or be fiber coupled diodes and combined with the fiber beam combiner.

It is a particularly advantageous feature of the invention that the first control loop (and optionally the second control loop) includes at least one of the modulated laser diode(s) only. The stable laser diode(s) is/are not included in one of the control loop(s). The configuration of the current source with modulation capability in terms of analogue control and broadband control directly effects the phase control and/or the oscillator intensity noise control of the output pulses.

In practice, the following particular advantages of the invention have been found:
1. Power scalability;
2. Low power laser diode can be used for CEP control, in particular CEP stabilization;
3. High CEP stability <250 mrad;
4. Further low power laser diode can be used for intensity noise stabilization; and
5. Beam combiner with low dependency on polarization of pumping light usable, in particular if diode laser light is randomly polarized after propagation inside a delivery fiber.

BRIEF DESCRIPTION OF THE DRAWINGS

Further details and advantages of the invention are described in the following with reference to the attached drawings, which show in.

DESCRIPTION OF THE PREFERRED EMBODIMENTS

Preferred embodiments of the invention are described in the following with particular reference to the configuration of the pump laser diodes and the control thereof. Further features of the pulse laser device, like the design of the resonator cavity or features of the control loops, are not described in detail if they are known as such from prior art (see e. g. resonator cavity in [3], and control loops in [10], [11]). According to the illustrated embodiments, the invention can be implemented with multiple configurations, including e. g. one or two modulated laser diodes and/or one or more stable laser diode.

Figure 1:
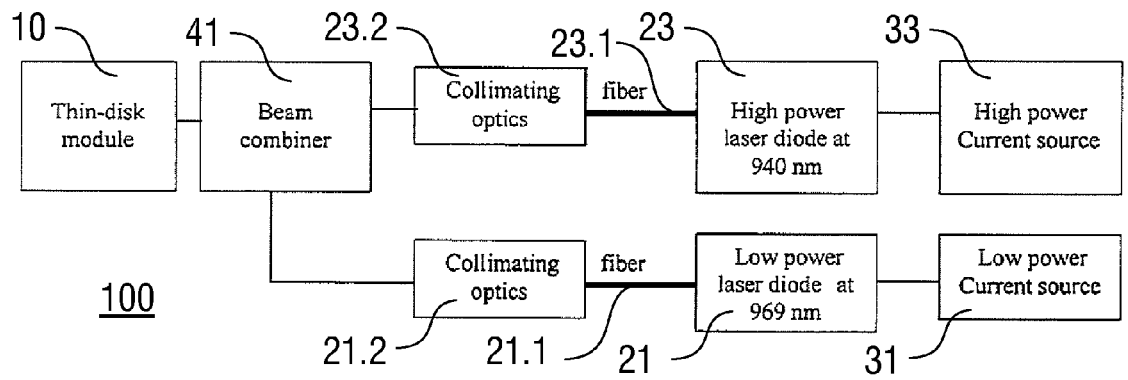
FIGS. 1 to 8: schematic representations of preferred embodiments of the pulses laser device according to the invention.
Figure 2:
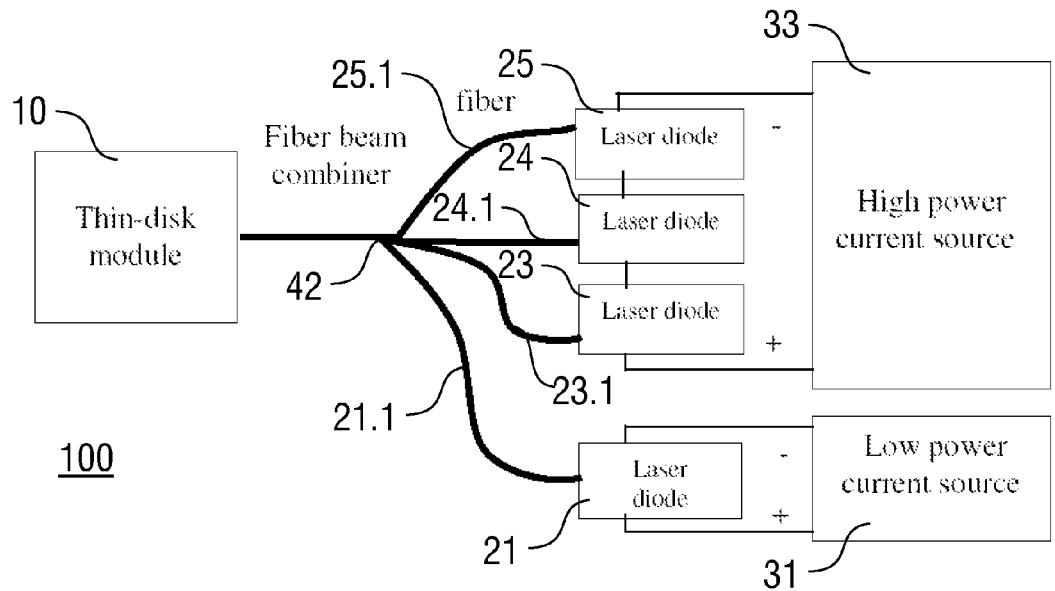
Figure 3:
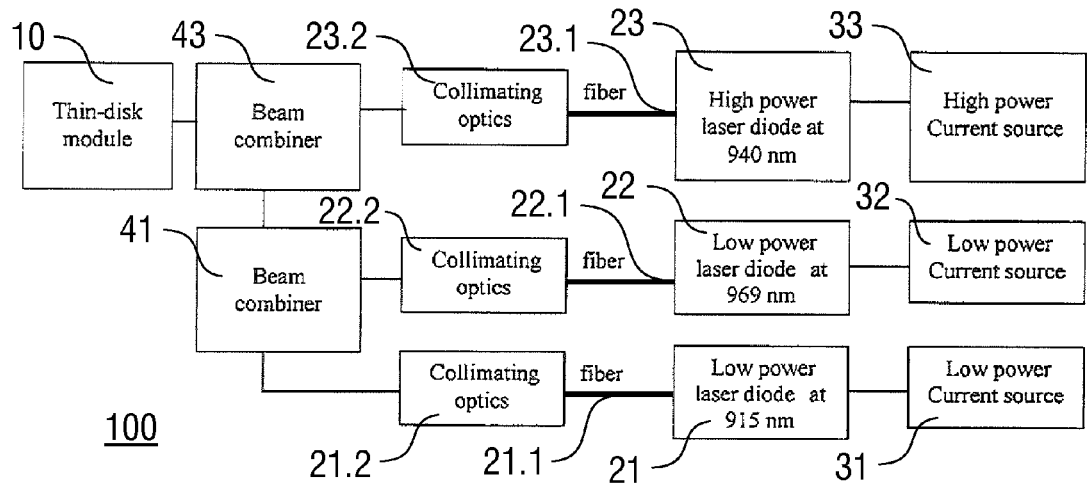

FIGS. 1, 2 and 3 illustrate basic embodiments of the invention, wherein one single modulated laser diode or multiple, e. g. two modulated laser diodes are provided in combination with one stable laser diode or multiple, e. g. three stable laser diodes, resp. FIGS. 4 to 8 illustrate preferred modifications of these embodiments, wherein the modulated laser diodes are controlled using first and/or second control loops, resp.

According to FIG. 1, the pulse laser device 100 comprises a thin disk module including a thin disk laser medium 10, like an Yb-YAG disk crystal with a thickness of 220 μm and a diameter of 10 mm. The Yb-YAG disk crystal has pronounced absorption maxima at 940 nm and at 969 nm and a further absorption band at 915 nm. The thin disk module is arranged in a resonator cavity (not shown). The thin disk laser medium is pumped with cw pump laser diodes, which comprise one single modulated laser diode 21 and one single stable laser diode 23, each being electrically connected with an associated current source. The modulated laser diode 21 (e. g. type: M1F2S22-968,5.[0,6]-12C-SS2.1-VBG, manufacturer: DILAS GmbH) has a cw pump light output at 969 nm. It is connected with a low power current source 31 with modulation capability (current source type e. g. LDX-32420, manufacturer: Newport), which can provide maximal electrical power of 80 W. The stable laser diode 23 (e. g. type: 500 W, coupled into the fiber with NA=0.22 and 1 mm diameter, manufacturer: Laserline GmbH) with a cw pump light output at 940 nm is driven with a stabilized high power current source (current source type e. g. LDX-36040-30, manufacturer: Newport), which can provide a maximal electrical power of 1200 W. According to the invention, the used in the practical application output power of the modulated laser diode 21 (mean output power e. g. 8 W) is smaller than the whole output power of the stabilized laser diode 23 (output power e. g. 220 W).

The outputs of both laser diodes are fiber-coupled with output fibers 21.1 and 23.1 to collimating optics 21.2 and 23.2, resp. The collimating optics 21.2 and 23.2 relay collimated pump light to the beam combiner 41 where the laser diode outputs are combined. The beam combiner 41 comprises a wavelength dependent combiner including at least one dichroic mirror. The combined pump light is directed to the laser medium 10 in the resonator cavity (not shown), where laser output pulses are created e. g. with the following parameters: power: 40 W, pulse duration 250 fs, repetition rate: 38 MHz and centre wavelength: about 1030 nm.

FIG. 2 shows an alternative embodiment of the pulse laser device 100, wherein the thin-disk laser medium 10, like the Yb-YAG disk crystal, is pumped with one single modulated laser diode 21 and multiple, e. g. three stable laser diodes 23, 24 and 25. The modulated laser diode 21 is operated as described with reference to FIG. 1. The stable laser diodes 23, 24 and 25 are connected with one common stabilized high power current source 33. All laser diode outputs are fiber-coupled with output fibers 21.1, 23.1, 24.1 and 25.1 to a fiber beam combiner 42 where the laser diode outputs of the modulated laser diode 21 and the stable laser diodes 23, 24 and 25 are combined and subsequently directed to the laser medium 10 in the resonator cavity (not shown). The fiber beam combiner 42 comprises a monolithic all-fiber beam combiner (known from the prior art), which superimposes the outputs from the pump laser diodes by a direct connection of the output fibers 21.1, 23.1, 24.1 and 25.1, resp.

According to FIG. 3, the pulse laser device 100 is configured similar to the above embodiments of FIGS. 1 and 2. Deviating from FIG. 1, the laser medium 10, like the Yb-YAG disk crystal, is pumped with two modulated laser diodes 21, 22 and one stable laser diode 23. The modulated laser diodes 21, 22 provide the output pump light at different wavelengths, which are selected in dependency on the absorption maxima of the Yb-YAG disk crystal, e.g. at 915 nm and 969 nm. The modulated laser diodes 21, 22 and the stable laser diode 23 are connected with separate low power current sources 31, 32 with modulation capability and a stabilized high power current source 33, resp. All laser diode outputs are fiber-coupled with output fibers 21.1, 22.1 and 23.1 to collimating optics 21.2, 22.2 and 23.2, resp. The collimating optics 21.2 and 22.2 relay collimated pump light to a first beam combiner 41 where the laser diode outputs of the modulated laser diodes 21, 22 are combined in a first step. Again, the first beam combiner 41 comprises a wavelength dependent combiner including at least one dichroic mirror. The combined beam is combined with the laser diode output of the stable laser diode 23 at a second beam combiner 43 and subsequently directed to the laser medium 10 in the resonator cavity (not shown).

For controlling an intensity noise and/or a carrier-envelope phase of laser output pulses of the pulse laser device 100, the output power of the modulated laser diode 21 (or: diodes and 22) is modulated by controlling the drive current thereof, while the stable laser diode 23 has a constant output power. Depending on the application, the modulation of the modulated laser diode 21, 22 can follow a predetermined time scheme, or it is stabilized using at least one control loop as shown in FIGS. 4 to 8.

Figure 4:
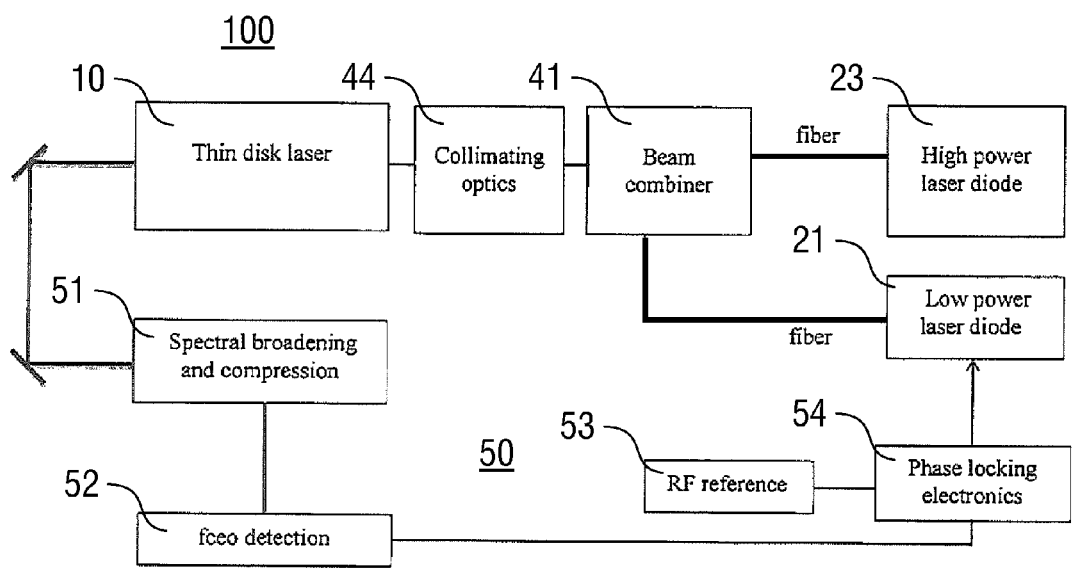
Figure 5:
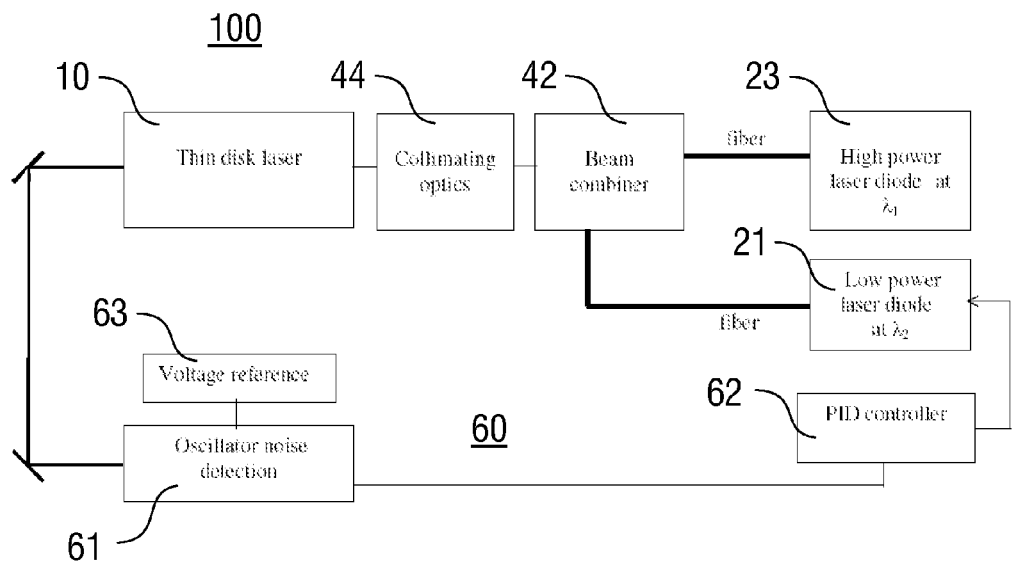
Figure 6:
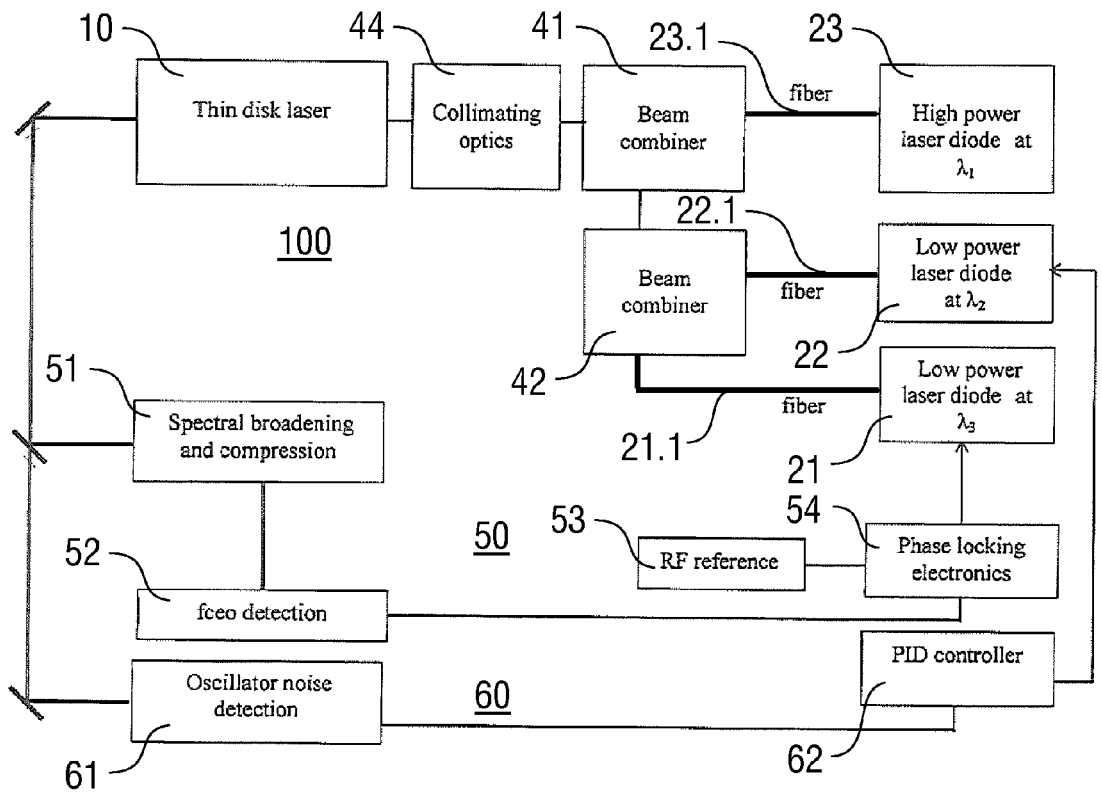

The embodiments of FIGS. 4 to 8 are configured with one or multiple modulated laser diodes 21, 22 like the embodiments of FIGS. 1 and 2, resp. Collimating optics 44 are used for directing the combined pump light to the laser medium 10 (FIGS. 4 to 6). Furthermore, deviating from the remaining illustrations, FIGS. 4 to 6 show the pump laser diodes 21, and 23 without separate current sources. With these embodiments, the current sources and diodes are provided as integrated units.

The pulse laser device 100 of FIG. 4 comprises one modulated laser diode 21 and one stable laser diode 23, both being operated at different wavelengths and being fibre coupled and combined with the beam combiner 41. The combined output is relayed via the collimating optics 44 to the thin-disk laser medium 10. According to FIG. 4, the pulse laser device 100 further includes a first control loop 50 (CEP loop) for a CEP feedback control of the modulated laser diode 21. The first control loop 50 includes a spectral broadening and compression unit 51, an $f_{CEO}$ detection unit 52, an RF reference unit 53 and phase locking electronics 54.

The spectral broadening and compression unit 51 comprises a 35 μm mode field diameter photonic crystal fiber (PCF, LMA35) and a combination of chirped compression mirrors. Output pulses of the pulse laser 100 are coupled as an input to the PCF. It is possible to couple the whole power available from the resonator cavity, or a part thereof, e. g. with a coupling efficiency of 85%. The chirped compression mirrors with GDD=−500 fs$^2$ and without compensation of higher-order dispersion are arranged for e. g. 8 reflections, leading to a pulse duration below 30 fs.

The spectrally broadened and compressed pulses are sent to the $f_{CEO}$ detection unit 52, which is arranged the carrier envelope offset (CEO) frequency of the pulse, which is a direct measure for the CEP of the output pulses of the pulse laser device 100. The $f_{CEO}$ detection unit 52 comprises an f-to-2 f-interferometer, e. g. as described in [6]. The octave spanning spectrum is generated with a PCF (SC-3.7-975, manufacturer: NKT photonics) with 3.7 μm core diameter by launching about 300 mW and 30 fs pulses. With alternative embodiments of the invention, a 2f-to-3f-interferometer or a monolithic DFG setup, as described in [7], can be used instead of the f-to-2f-interferometer.

The RF reference unit 53 comprises a stabilized radiofrequency source (e. g. 10.5 MHz). The phase locking electronics 54 include a phase detector detecting a frequency difference between the reference signal from the RF reference unit 53 and the output of the $f_{CEO}$ detection unit 52 and controlling the drive current of the modulated laser diode 21. In practical tests, the CEO frequency was tuned to stay close to 10.5 MHz, and then this signal was band pass filtered, amplified and sent to a first phase detector input of the phase locking electronics 54. The reference signal from the RF reference unit 53 was fed to the second phase detector input of the phase locking electronics 54. CEO frequency sensitivity due to the variation of the drive current was found to be about 4 MHz/W at 200 W pump power.

Figure 9:
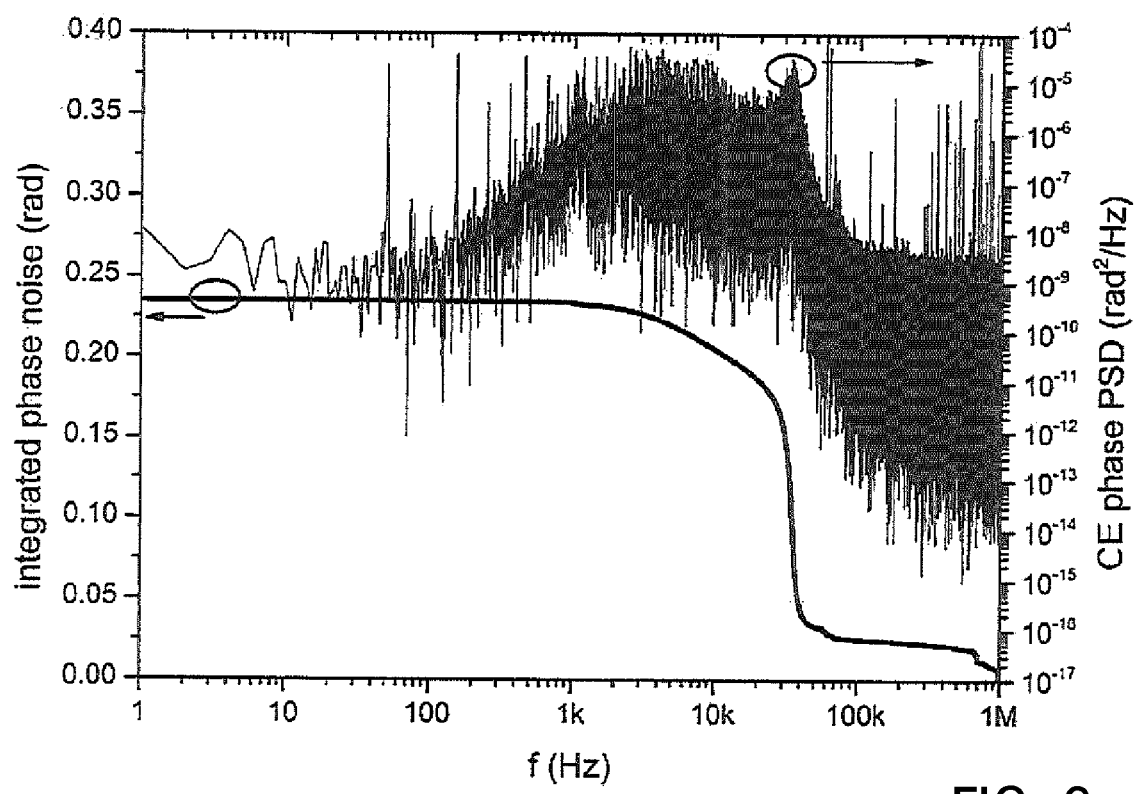
FIG. 9: experimental results obtained with the CEP control according to the invention.

FIG. 9 shows an experimental result obtained with the embodiment of FIG. 4. The CEP error measured with the first control loop 50 including the f-to-2f-interferometer and a 4 bit digital phase detector shows a tight locking of the CEP and demonstrates the phase noise around 250 mrad measured in the 1 Hz to 1 MHz bandwidth.

The pulse laser device 100 of FIG. 5 comprises one modulated laser diode 21 and one stable laser diode 23, the beam combiner 42, the collimating optics 44 and the thin-disk laser medium 10 as shown in FIG. 4. Furthermore, according to FIG. 5, the pulse laser device 100 includes a second control loop 60 (intensity noise loop) for an intensity feedback control of the modulated laser diode 21. The second control loop 60 includes an oscillator noise detection unit 61, a voltage reference source 63 and a PID controller 62, which is arranged for controlling the drive current of the modulated laser diode 21. The oscillator noise detection unit 61 detects intensity fluctuations of the output pulses of the pulse laser device 100 relative to a reference voltage provided by the voltage reference source 63. The error signal from the PID controller 62 is fed to the current source of the modulated laser diode 21. Advantageously, the second control loop 60 allows a reduction of intensity noise fluctuations, which could be introduced by a residual noise of the stabilized laser diode or oscillator itself.

According to FIG. 6, the pulse laser device 100 includes both the first control loop 50 and additionally the second control loop 60 for oscillator intensity noise compensation. As described with reference to FIG. 3, the pulse laser device 100 includes first and second modulated laser diodes 21, 22 and a stable laser diode 23. The pump laser diodes 21, 22 and 23 emit at different wavelengths $\lambda_1$, $\lambda_2$ and $\lambda_3$, which are selected in dependency on the absorption maxima of the laser medium 10. The output of the pump laser diodes 21, 22 and 23 is combined with two steps using the fiber beam combiners 41, 42. The combined output is directed with collimating optics 44 to the laser medium 10. The first control loop 50 is configured with the components 51 to 54 and controls the first modulated laser diode 21 as described with reference to FIG. 3. The second control loop 60 is configured with the components 61 to 63 and controls the second modulated laser diode 22 as described with reference to FIG. 4.

Figure 7:
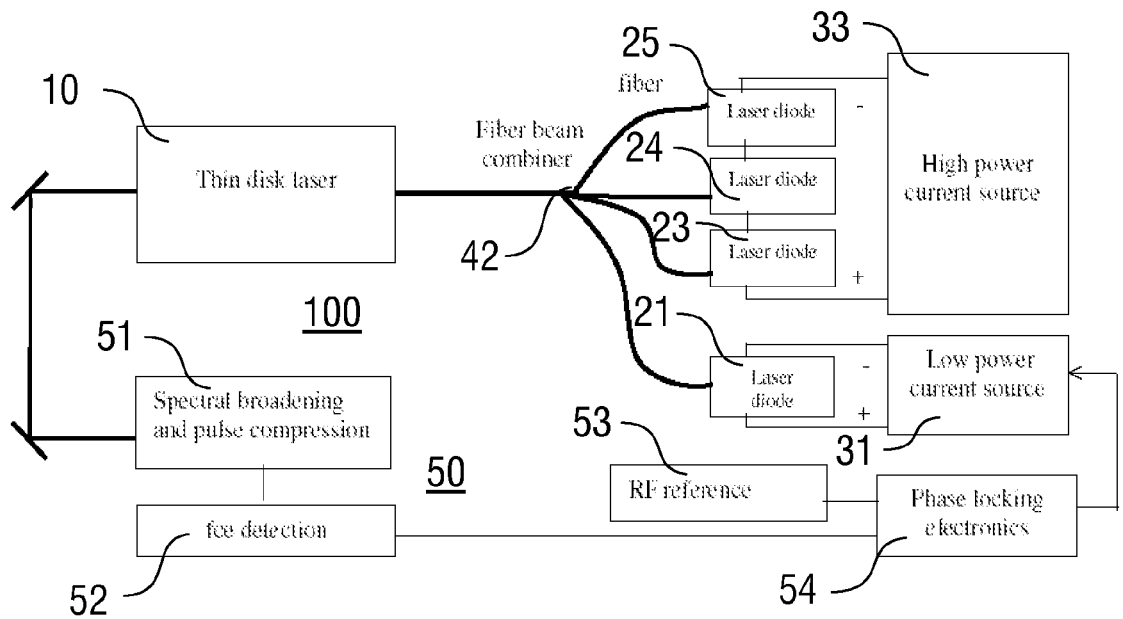
Figure 8:
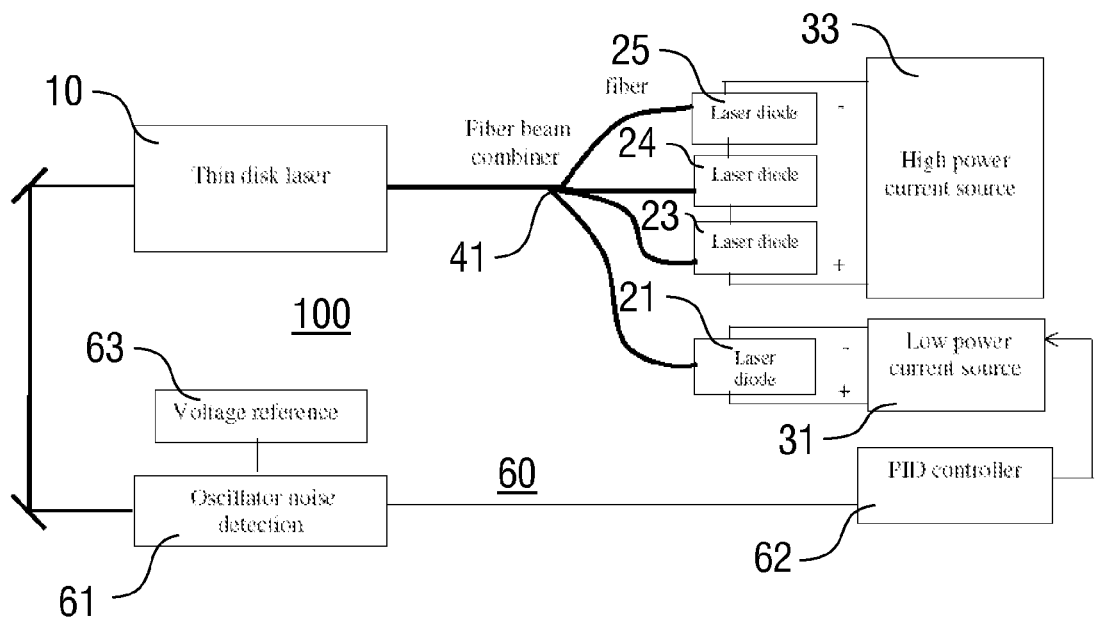

FIGS. 7 and 8 show further embodiments of the invention, wherein the first control loop 50 or the second control loop is provided with the embodiment of the pulse laser device 100 as shown in FIG. 2. Again, the beam combiners 42 in FIGS. 7 and 8 comprise monolithic all-fiber beam combiners, which superimpose the output from the pump laser diodes by a direct connection of the output fibers. As a further alternative, both of the first and second control loops 50, 60 can be provided with the fibre coupled embodiment of FIG. 2, preferably if two separate modulated laser diodes are provided.

The features of the invention in the above description, the drawings and the claims can be of significance both individually as well as in combination for the realization of the invention in its various embodiments.

What is claimed is:

1. A method of controlling output pulses of a pulse laser device including a thin-disk laser medium, in particular controlling at least one of a carrier-envelope phase and an intensity of the output pulses, said method comprising the steps of
   pumping the thin-disk laser medium of the pulse laser device with multiple pump laser diodes, which include at least one modulated laser diode which is powered by a current source with modulation capability, and
   controlling the output pulses by modulating an output power of the at least one modulated laser diode, which is modulated by controlling a drive current thereof, wherein
   the pump laser diodes further include at least one stable laser diode, which has a constant output power, and
   the output power of the at least one modulated laser diode is smaller than a whole output power of the at least one stable laser diode.

2. The method according to claim 1, wherein the output of the at least one stable laser diode and the output of the at least one modulated laser diode are combined by
   a beam combiner which is configured for a free space beam combination, or
   a fiber beam combiner.

3. The method according to claim 1, including at least one of the features
   a modulation depth of the output power of the at least one modulated laser diode is at least 2% a pump power absorbed by the thin-disk laser medium,
   a modulation depth of the output power of the at least one modulated laser diode is at most 20% of a pump power absorbed by the thin-disk laser medium,
   an oscillator intensity noise of the output pulses is controlled by modulating the output power of the at least one modulated laser diode,
   the carrier-envelope phase of the output pulses is controlled by modulating the output power of the at least one modulated laser diode, the at least one stable laser diode and the at least one modulated laser diode are operated at different output wavelengths selected in accordance to absorption maxima of the thin-disk laser medium, the at least one stable laser diode and the at least one modulated laser diode are operated at different polarizations, and the at least one stable laser diode and the at least one modulated laser diode are fiber coupled and combined with a fiber beam combiner.

4. The method according to claim 1, including at least one of the features the at least one modulated laser diode is modulated by an analogue control of the drive current thereof, and the at least one modulated laser diode is modulated with a broadband control.

5. The method according to claim 1, wherein the carrier-envelope phase of the output pulses is controlled using a first control loop, wherein the drive current of the at least one modulated laser diode is controlled in dependency on a detected carrier-envelope offset frequency of the output pulses and a radiofrequency reference signal.

6. The method according to claim 1, wherein an intensity noise of the output pulses is controlled using a second control loop, wherein the drive current of the at least one modulated laser diode is controlled in dependency on a detected oscillator noise.

7. The method according to claim 5, wherein the pump laser diodes include at least two modulated laser diodes, the first control loop is used for controlling a first one of the two modulated laser diodes, and a second control loop is used for controlling a second one of the at least two modulated laser diodes, the drive current of which being controlled in dependency on a detected oscillator noise.

8. The method according to claim 7, including at least one of the features the modulated laser diodes are operated at different output wavelengths selected in accordance to absorption maxima of the thin-disk laser medium, the modulated laser diodes are operated at different polarizations, and the modulated laser diodes are fiber coupled diodes combined with a fiber beam combiner.

9. A pulse laser device, being adapted for creating output pulses, comprising a thin-disk laser medium, and multiple pump laser diodes being arranged for pumping the thin-disk laser medium and including at least one modulated laser diode, which is connected with a current source with modulation capability, wherein the current source with modulation capability is arranged for modulating a drive current of the respective modulated laser diode, so that output pulses can be controlled by modulating output power of the at least one modulated laser diode, the pump laser diodes further comprise at least one stable laser diode, which is connected with a stabilized current source, and the at least one modulated laser diode and the related current source with modulation capability are configured such that the output power of the at least one modulated laser diode is smaller than a whole output power of the at least one stable laser diode.

10. The pulse laser device according to claim 9, further comprising a beam combiner which is configured for a free space beam combination of the output of the at least one stable laser diode and the output of the at least one modulated laser diode, or a fiber beam combiner which is configured for an integrated fiber combination of the output of the at least one stable laser diode and the output of the at least one modulated laser diode.

11. The pulse laser device according to claim 9, comprising at least one of the features the at least one modulated laser diode and the related current source with modulation capability are configured such that a modulation depth of the output power of the modulated laser diode is at least 2% of the whole output power of the at least one stable laser diode, and the at least one modulated laser diode and the related current source with modulation capability are configured such that a modulation depth of the output power of the modulated laser diode is at most 20% of a pump power absorbed by the thin-disk laser medium, and the current source with modulation capability is arranged for modulating the drive current of the at least one modulated laser diode, so that an oscillator intensity noise of the output pulses can be controlled by modulating the output power of the at least one modulated laser diode.

12. The pulse laser device according to claim 9, comprising at least one of the features the current source with modulation capability is adapted for an analogue control of the at least one modulated laser diode, the current source with modulation capability is adapted for a broadband control of the at least one modulated laser diode, the at least one stable laser diode and the at least one modulated laser diode have different output wavelengths selected in accordance to absorption maxima of the thin-disk laser medium, the at least one stable laser diode and the at least one modulated laser diode are configured for emitting laser light with different polarizations, and the at least one stable laser diode and the at least one modulated laser diode are fiber coupled and combined with a fiber beam combiner.

13. The pulse laser device according to claim 9, further comprising a first control loop for controlling the carrier-envelope phase of the output pulses, wherein the drive current of the at least one modulated laser diode is controlled in dependency on a detected carrier-envelope offset frequency of the output pulses and a radiofrequency reference signal.

14. The pulse laser device according to claim 13, further comprising a second control loop for controlling an intensity noise of the output pulses, wherein the drive current of the at least one modulated laser diode is controlled in dependency on a detected oscillator noise.

15. The pulse laser device according to claim 14, wherein the pump laser diodes include at least two modulated laser diodes, the first control loop is used for controlling a first one of the two modulated laser diodes, and a second control loop is used for controlling a second one of the two modulated laser diodes, the drive current of which being controlled in dependency on a detected oscillator noise.

* * * * *